US005687129A

United States Patent [19]
Kim

[11] Patent Number: 5,687,129
[45] Date of Patent: Nov. 11, 1997

[54] METHOD AND CIRCUIT FOR SUPPLYING MEMORY IC POWER

[75] Inventor: Myoung-Kee Kim, Cheongju, Rep. of Korea

[73] Assignee: LG Semicon, Co. Ltd., Cheongju, Rep. of Korea

[21] Appl. No.: 639,465

[22] Filed: Apr. 29, 1996

[30] Foreign Application Priority Data

Apr. 27, 1995 [KR] Rep. of Korea .............. 95-10039

[51] Int. Cl.$^6$ .................................. G11C 11/412
[52] U.S. Cl. ................................. 365/229; 365/228
[58] Field of Search .................... 365/229, 228, 365/227, 226

[56] References Cited

U.S. PATENT DOCUMENTS

| | | | |
|---|---|---|---|
| 5,047,988 | 9/1991 | Mizuta et al. | 365/229 |
| 5,058,075 | 10/1991 | Mizuta et al. | 365/229 |
| 5,212,664 | 5/1993 | Shinohara | 365/229 |
| 5,384,748 | 1/1995 | Sanemitsu | 365/229 |

Primary Examiner—David C. Nelms
Assistant Examiner—Vu A. Le
Attorney, Agent, or Firm—Laudermilk & Associates

[57] ABSTRACT

A circuit for supplying power to an IC memory card by using primary and secondary batteries as a data preserving power means for the memory IC according to the present invention, includes: primary and secondary batteries; a secondary battery charging circuit for charging the secondary battery; and a primary and secondary battery backup circuit for connecting the primary and secondary batteries to the memory IC when an external power source is disconnected; a serial-parallel switching means for connecting the primary and secondary batteries in series or in parallel; a voltage detecting means for comparing a power voltage of the memory IC with a reference voltage to generate a voltage detection signal upon finding the power voltage dropped to below the reference voltage; and a switching control means for receiving the voltage detection signal of the voltage detecting means to control the serial-parallel switching means so as to connect the primary and secondary batteries in series or in parallel.

30 Claims, 2 Drawing Sheets

METHOD AND CIRCUIT FOR SUPPLYING MEMORY IC POWER

FIELD OF THE INVENTION

The present invention relates to a method for supplying power to a volatile memory, such as an IC memory card using a battery backup, and a circuit extending the backup time provided to data in the memory.

DESCRIPTION OF THE PRIOR ART

A conventional IC memory card is a small electronics card (about the size of a credit card), and stores a large amount of information that can be used for various purposes. In this conventional IC memory card, however, as in other volatile memories, in order to preserve the memory IC data, a power source must always be supplied.

FIG. 1 illustrates a circuit for supplying power to the IC memory, in which only a primary battery is used for backup in the event external power is disconnected.

In this circuit, an external power source is connected to power terminal 1 and supplies power and voltage through external power line 2 to power source IC 3 which performs a voltage adjusting function. Another terminal of power source IC 3 is connected to ground line (GND) 10, and still another terminal (output terminal) of power source IC 3 is connected to internal power line 4 so as to be connected to a cathode of diode 5 and a power terminal of memory IC 8. An anode of diode 5 is connected to a terminal of resistor 6, and the other terminal of resistor 6 is connected to a positive terminal of primary battery 7. A negative terminal of primary battery 7 is connected to the ground, and ground terminal 9 is connected to internal ground line 10.

In order to preserve the data in memory IC 8, a power source has to be supplied all the time. In the operation of this circuit, this goal is achieved partially because even if the external power source which has been connected to positive and negative terminals 1 and 9 is disconnected, power is continuously supplied by an internal power supply means which is connected to primary battery 7, resistor 6 and diode 5. Consequently, power can be supplied to memory IC 8 thereby preserving the data until this primary battery is drained.

For purposes of the following discussion, the output voltage of power source IC 3 is indicated by $V_{ICO}$; the voltage of primary battery 7 is indicated by $V_{BT7}$; the forward voltage drop of diode 5 is indicated by $V_{D5}$; the current flowing through the power source IC is indicated by $I_{ICO}$ and the current flowing through diode 5 is indicated by $I_{D5}$.

When a normal external voltage is supplied, that is, when $V_{ICO}>V_{BT7}-V_{D5}$, $I_{D5}$ becomes approximately zero. Consequently, there is no current consumption in primary battery 7, and a voltage $V_{ICO}$ appears on internal power line 4. However, if the externally supplied voltage is lowered or disconnected for some reason so that $V_{ICO}<V_{BT7}-V_{D5}$, then $I_{ICO}$ approximately becomes zero. Further, $V_{BT7}-V_{D5}$ appears through primary battery 7 to internal power line 4 and is supplied as a voltage to the memory IC.

Through such an operation, power is continuously supplied through internal power line 4, so that a power source is never disconnected from memory IC 8, thereby preserving the data of the memory IC. However, there is a limit to the capacity of the primary battery, and therefore, after of a certain time period elapses, the voltage of the battery drops to below a data preserving limit, with the result that the goal of preserving the data fails.

In the circuit of FIG. 1, the life expectancy of the primary battery is limited, and therefore, the data preserving period is not lengthy. Therefore, in an attempt to extend the data preserving period, a circuit was proposed in which both a primary battery and a secondary battery are used as illustrated in FIG. 2.

In this circuit, an external power source is connected to power terminal 1, and further through external power line 2 to power source IC 3 and to a terminal of resistor 11. Further, another terminal (output terminal) of power source IC 3 is connected to internal power line 4 and to the cathodes of diodes 5 and 14, and is also connected to a power terminal of memory IC 8. Another terminal of resistor 11 is connected to cathode of zener diode 12 and an anode of diode 13, while an anode of the zener diode is connected to ground. A cathode of diode 13 is connected to resistor 15, and another terminal of this resistor is connected to a positive terminal of secondary battery 16 and to an anode of diode 14. An anode of diode 5 is connected to resistor 6, and another terminal of this resistor is connected to a positive terminal of primary battery 7, while a negative terminal of secondary battery 16, a negative terminal of primary battery 7 and a negative terminal of memory IC 8 are connected to ground line 10. Further, negative terminal 9 of the external power source is also connected to internal ground line 10.

The operation of this circuit as relates to primary battery 7 is similar to that of the circuit of FIG. 1. That is, if the voltage of internal power line 4 is lowered, then the voltage of the primary battery is supplied through resistor 6 and diode 5 to memory IC 8.

When a normal voltage is supplied from the external power source, secondary battery 16 is charged through resistor 11 and diode 13. For purposes of the following discussion, the voltage of zener diode 12 is indicated by $V_{ZD}$, the forward voltage drop of diode 13 is indicated by $V_{D13}$, and the voltage of secondary battery 16 is indicated by $V_{BT16}$. Further it is generally assumed that $V_{BT16}>V_{BT7}$. External power which is supplied to power source terminal 1 is supplied through resistor 11 to zener diode 12, and a voltage of $V_{ZD}-V_{D13}$ is supplied to secondary battery 16, with the result that secondary battery 16 is kept charged during this time Further, this external power source supplies an output voltage $V_{ICO}$ through power source IC 3 to internal power line 4; this voltage $V_{ICO}$ is larger than $V_{BT16}-V_{D14}$ and $V_{BT7}-V_{D5}$. Therefore, a current $I_{ICO}$ flows through power source IC and supplies power to memory IC 8, while charge in primary and secondary batteries is not consumed.

If the external power is disconnected for some reason from the power terminal, then power is supplied from primary battery 7 and secondary battery 16 to internal power line 4. But since $V_{BT16}>V_{BT7}$ the secondary battery first supplies power through diode 14 to memory IC 8. If the power consumption progresses until $V_{BT16}$ becomes approximately the same as $V_{BT7}$, then the primary and secondary batteries both supply power. Therefore, the supply of power and voltage can be continued longer than in the circuit of FIG. 1, with the result that the data can be preserved longer.

In this case, however, as with the first case, there are limits in the capacity of the primary and secondary batteries. Therefore, after a certain period of time elapses, the voltage of the batteries drops to below the data preserving limit voltage, thereby again failing to preserve the data.

SUMMARY OF THE INVENTION

The present invention is intended to overcome the above described disadvantages of the conventional techniques.

Therefore it is an object of the present invention to provide an improved method and a circuit for supplying power to an IC memory card or some other volatile memory device that requires power, in which the conventional technique of extending the data preserving period by using primary and secondary batteries, so that the supply of power and voltage is continued for a period longer than in conventional techniques and thereby extending the data preserving period.

In the present invention, when the primary and secondary batteries are individually exhausted below the data preservation limit voltage, they are then connected in series with each other so that power and voltage can be maintained above the data preservation limit voltage for an extra considerable period of time.

To achieve this object, the circuit for supplying power to an IC memory card by using primary and secondary batteries as a data preserving power means for the memory IC according to the present invention, includes: primary and secondary batteries; a secondary battery charging circuit for charging the secondary battery; and a primary and secondary battery backup circuit for connecting the primary and secondary batteries to the memory IC when an external power source is disconnected. A serial-parallel switching means is used for connecting the primary and secondary batteries in series or in parallel, and a voltage detecting means is used for comparing a power voltage of the memory IC with a reference voltage to generate a voltage detection signal upon finding the power dropped to below the reference voltage. Finally, a switching control means is used for receiving the voltage detection signal of the voltage detecting means to control the serial-parallel switching means so as to connect the primary and secondary batteries in series or in parallel.

The voltage detecting means is a conventional comparator that compares an IC reference voltage with the voltage being supplied to the memory IC. The switching control means is a JK flip flop for receiving the voltage detection signal of the voltage detecting means through a clock input terminal and for receiving the external power voltage through a reset terminal to control the voltage of an output terminal to be high or low.

In another aspect of the present invention, a method for supplying power to an IC memory card according to the present invention is characterized in that: when external power is not provided, primary and secondary batteries are connected in parallel to supply power to the memory IC; and if the voltages of the primary and secondary batteries drop to below a reference voltage, then the primary and secondary batteries are connected in series so as to supply power in combination to the memory IC.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

Figure 1:
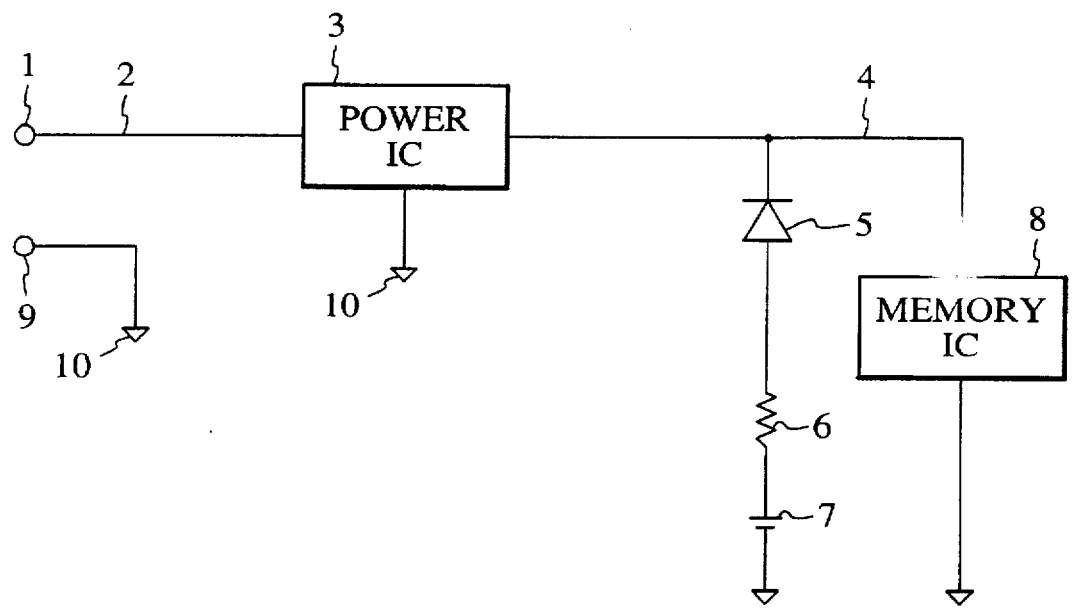
FIG. 1 illustrates a conventional circuit for supplying power to the IC memory card.
Figure 2:
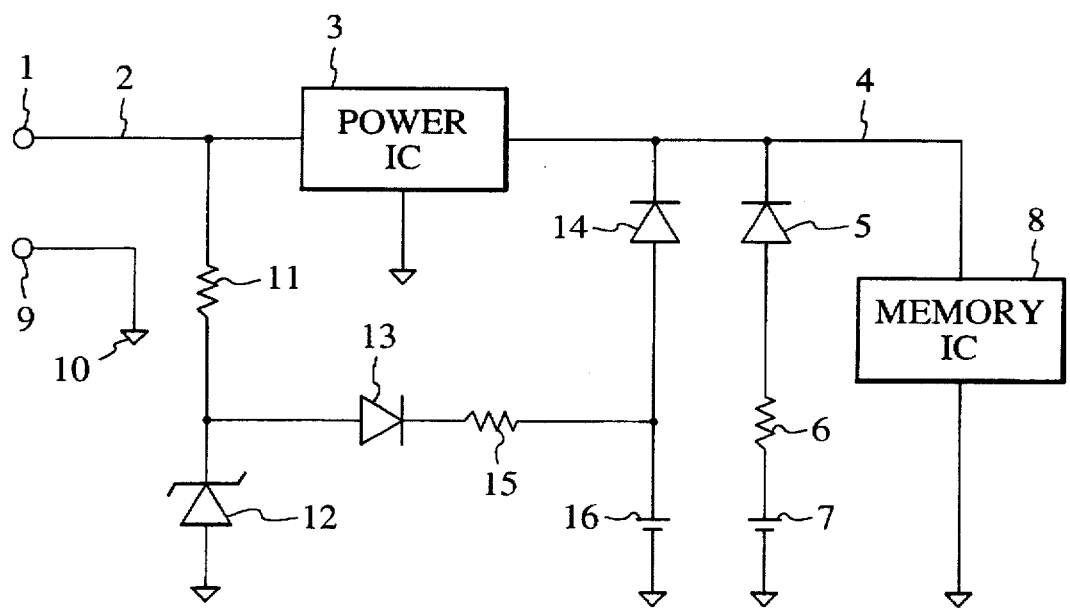
FIG. 2 illustrates another conventional circuit for supplying power to the IC memory card.
Figure 3:
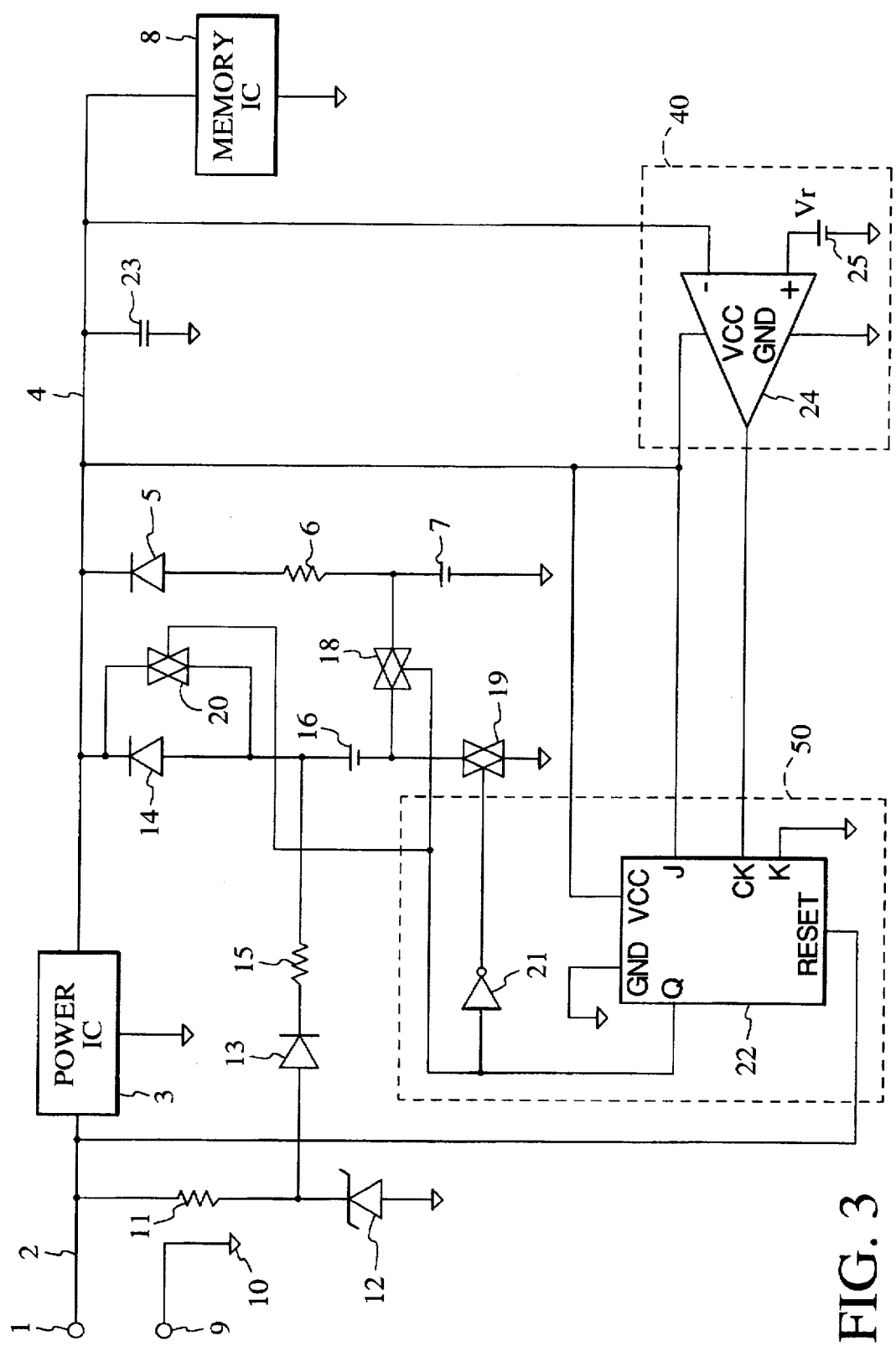
FIG. 3 illustrates a representative circuit for supplying power to the IC memory card according to the present invention.

FIG. 3 illustrates a specific embodiment of the present invention. Elements performing essentially the same functions as corresponding elements found in prior art devices depicted in FIGS. 1 and 2 are referred with the same reference number unless otherwise indicated.

The circuit for supplying power to an IC memory card according to the present invention includes: primary and secondary batteries 7 and 16; a secondary battery charging circuit for charging secondary battery 16; and a primary and secondary battery backup circuit for connecting the primary and secondary batteries to the memory IC when an external power source is disconnected; serial-parallel switching means for connecting the primary and secondary batteries in series or in parallel; voltage detecting means 40 for comparing a power voltage supplied to the memory IC with a reference voltage to generate a voltage detection signal when the power voltage drops below the reference voltage; and switching control means 50 for receiving the voltage detection signal of the voltage detecting means and for controlling the serial-parallel switching means so as to connect the primary and secondary batteries in series or in parallel.

If an external power source is connected to power terminal 1, then power source IC 3 is connected through external power line 2, so that the output of power source IC 3 is supplied to a memory IC.

For primary battery 7, a serial circuit composed of a ground line, battery 7, resistor 6, diode 5, internal power line 4 and memory IC 8 acts as a first path for discharging charge and supplying power and voltage to memory IC 8.

For secondary battery 16, two discharge paths exist. The first includes a ground line, a first switch 19, secondary battery 16, diode 14, internal power line 4 and memory IC 8. The second discharge path is composed of a ground line, primary battery 7, second switch 18, secondary battery 16, third switch 20, internal power line 4 and memory IC 8.

A secondary battery charging circuit for charging secondary battery 16 is constituted such that external power (connected through power terminal 1) is connected through line 2 and resistor 11 to a cathode of zener diode 12 and an anode of diode 13. Further, the anode of zener diode 12 is connected to a ground line, and a cathode of diode 13 is connected through resistor 15 to an anode of the secondary battery, while a cathode of secondary battery 16 is grounded through first switch 19.

The serial-parallel switching means for connecting the primary and secondary batteries in series or in parallel includes: first switch 19 connected between ground and the cathode of secondary battery 16; second switch 18 connected between the anode of primary battery 7 and the cathode of secondary battery 16; and third switch 20 connected between the anode of secondary battery 16 and the power terminal of memory IC 8, and connected in parallel with diode 14.

Voltage detecting means 40 for generating voltage detection signals includes comparator 24 for receiving reference voltage 25 into one input terminal and for receiving a signal corresponding to the voltage provided to the memory IC through another input terminal. If the voltage supplied to memory IC 8 becomes lower than reference voltage 25, comparator 24 shifts the voltage level of the output line into high or low level.

A switching control means 50 controls whether primary battery 7 and secondary battery 16 are connected in a serial path or parallel path. A JK flip flop 22 is used. On flip flop 22, terminal J is connected to the output of power IC 3; terminal K terminal is grounded, while terminal CK is connected to the voltage detection signal output from comparator 24. Further, a reset terminal RESET is connected to the external power line, and output terminal Q is connected to both the second and third switches and is also connected through invertor 21 to the first switch.

Completing the description of the overall circuit, external power source is connected to line 2, and is also connected to a terminal of resistor 11, to an input terminal of power source IC 3, and to reset terminal RESET of JK flip flop. Another terminal of resistor 11 is connected to the cathode of zener diode 12 and to the anode of diode 13, while the anode of zener diode 12 is connected to ground line 10. The cathode of diode 13 is connected through resistor 15 to the anode of diode 14, to a terminal of third switch 20, and to the positive terminal of secondary battery 16.

The negative terminal of secondary battery 16 is connected to a terminal of first switch 19, and another terminal of first switch 19 is connected to ground. Another terminal of resistor 6 is connected to the anode of diode 5. A terminal of power source IC 3 is connected to a ground line, and another terminal (output terminal) of it is connected to internal power line 4, to the cathodes of diodes 14 and 5, to another terminal of third switch 20, to a terminal of capacitor 23, to a Vcc terminal and J input terminal of JK flip flop 22, to a Vcc terminal and negative input terminal of comparator 24, and to the power terminal of memory IC 8. Another terminal of capacitor 23 is connected to a ground line, and another terminal of memory IC 8 is also connected to a ground line. Positive input terminal of comparator 24 is connected to reference voltage 25 which reference has a negative terminal connected to a ground line.

Terminal GND of comparator 24 is connected to a ground line, and output terminal of comparator 24 is connected to input terminal CK of JK flip flop 22. For flip flop 22, input terminal K is connected to a ground line. Output terminal Q of JK flip flop 22 is connected to control terminals of second switch 18 and third switch 20, and to first switch 19 through invertor 21. Terminal GND of JK flip flop 22 is connected to ground.

The operation of the circuit of the present invention as constituted above will now be described.

(1) Case when external power is provided.

If external power is provided through power terminal 1 into power source IC 3, a voltage equivalent to $V_{ZD}$ is supplied through resistor 11 to zener diode 12, while voltage $V_{ICO}$ appears on internal power line 4 as an output of power source IC 3.

This voltage $V_{ZD}$ is supplied through diode 13 and resistor 15 to the positive terminal of secondary battery 16 so that the secondary battery is kept charged by voltage $V_{BT16}$.

(2) Case when external power is disconnected or disrupted.

If external power is disconnected, $V_{ZD}$ is approximately equal to zero, and JK flip flop 22 is no longer reset, and is thereby released leading to a normal operation mode. However, at this time, second and third switches 18 and 20 are turned-off, while first switch 19 is turned-on.

Therefore, whichever one of primary and secondary batteries 7 and 16 has a higher voltage supplies a backup voltage to internal power line 4. This voltage is equivalent to $V_{BT16}-V_{D5}$, because the voltage of secondary battery 16 is designed to be higher. After the use of the secondary battery alone, if the voltage of the secondary battery drops below a threshold, then the primary and secondary batteries both supply the backup voltage simultaneously.

However, the voltage on internal power line (and which is supplied to memory IC 8) is connected to the negative terminal of comparator 24, and the positive terminal of comparator 24 is connected to the positive side of reference voltage 25 (reference voltage $V_R$ is set to a certain constant value which can preserve the data in the memory IC). Therefore, the output of comparator 24 is a function of the inputs on the negative and positive terminals. That is, if the voltage of the negative terminal is higher than that of the positive terminal, a low output is outputted, while in the opposite case, a high output is outputted. Clock signal CK carries out a trigger at a high edge.

If the consumption of the two batteries together is further continued so that $V_{ICO}<V_R$, the output of comparator 24 is shifted to a high level, and output Q of JK flip flop 22 also goes high. Further, the second and third switches are turned on, and first switch 19 is turned off, with the result that the two batteries are connected in series. This also removes diode 14 from the discharge path. Consequently, the voltage relation becomes $V_{ICO}=V_{BT16}+V_{BT7}$, and the diode forward voltage drop portion is recovered, so that adequate power and voltage can be supplied even longer to memory IC 8.

According to the present invention as described above, first, secondary battery 16 is used, and then primary and secondary batteries 7 and 16, connected in parallel, are used. When these batteries begin to be exhausted, they are switched so as to be connected in series. This helps use the remaining power in these batteries to the maximum degree, thereby continuously preserving the data of the memory IC for a longer period than that previously provided by prior art circuits and methods. When the batteries are connected in series, the diode is removed, so that the batteries can be used longer as much as the forward voltage drop portion.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A circuit for supplying power to an IC memory, said circuit including a reserve power supply having primary and secondary batteries; a secondary battery charging circuit for charging said secondary battery; and a primary and secondary battery backup circuit for providing power and voltage to the IC memory when an external power source providing external power and voltage is disconnected, the circuit further comprising:

switching means for connecting said primary and secondary batteries in series or in parallel;

voltage detecting means for comparing voltage provided to said IC memory with a reference voltage to generate a voltage detection signal when the provided voltage drops below a reference voltage; and switching control means for receiving the voltage detection signal from said voltage detecting means to control said switching means;

wherein when said external power source is disconnected, the switching means connects said primary and secondary batteries in parallel if the voltage provided to the IC memory is not below the reference voltage level, and alternatively connects the primary and secondary batteries in series if the voltage provided to the IC memory drops below the reference voltage level.

2. The circuit of claim 1, wherein said voltage detecting means is a comparator.

3. The circuit of claim 1, wherein said switching means comprises:

a first switch connected between a negative terminal of said secondary battery and a ground line;

a second switch connected between a positive terminal of said primary battery and the negative terminal of said secondary battery; and a third switch connected between a positive terminal of said secondary battery and a power terminal of said IC memory.

4. The circuit of claim 1, wherein said switching control means comprises:

a JK flip flop for receiving a voltage detection signal from said voltage detecting means through a clock input terminal, and for receiving an external power voltage through a reset terminal, so as output a high or low voltage level at an output terminal.

5. The circuit of claim 3, wherein said switching control means comprises:

a JK flip flop for receiving the voltage detection signal from said voltage detecting means through a clock input terminal, and for receiving an external power voltage through a reset terminal so as to output a high or low voltage level at an output terminal; and wherein the output of the flip flop is connected to said second and third switches, and the output of the flip flop is further connected through an invertor to said first switch.

6. The circuit of claim 3, wherein the first switch connects the secondary battery so that the primary and secondary batteries are in parallel first and second electrical paths, and the second and third switches connect the primary and secondary batteries in a serial third electrical path.

7. The circuit of claim 6, wherein:

the first electrical path includes a first ground voltage, the first switch, the secondary battery and a first diode connected to said IC memory;

the second electrical path includes a second ground voltage, the primary battery, a resistor and a second diode connected to said IC memory; and the third electrical path includes the second ground voltage, the primary battery, the second switch, the secondary battery and the third switch connected to said IC memory.

8. A method for supplying power to an IC memory, said circuit including a reserve power supply including primary and secondary batteries, a secondary battery charging circuit for charging said secondary battery, and a primary and secondary battery backup circuit for connecting said primary and secondary batteries to the IC memory, said method comprising the steps of:

providing power and operating voltage from said secondary battery to said IC memory along a first electrical path when primary power to said IC memory is discontinued;

providing power and operating voltage from said primary battery to said IC memory along a second electrical path and in parallel providing power and operating voltage from said secondary battery to said IC memory along the first electrical path when primary power to said IC is discontinued, and voltage supplied by said secondary battery falls below a voltage level supplied by said primary battery;

providing power and operating voltage from said primary battery and said secondary battery along a third electrical path to said IC memory when primary power to said IC is discontinued and the voltage supplied by said primary and secondary batteries falls below a reference level, wherein the primary and second batteries are connected in series in the third electrical path.

9. The method of claim 8, wherein a first switch is used for electrically connecting only the first and second electrical paths to the IC memory to provide power and voltage when the voltage supplied by said primary and secondary batteries exceeds a reference level, and second and third switches are used for electrically connecting only the third electrical path to said IC memory to provide power and voltage when the voltage supplied by said primary and secondary batteries falls below a reference level.

10. The method of claim 9, further comprising the steps of:

comparing the voltage supplied to said IC memory by said primary and secondary batteries with a reference voltage, and generating a voltage detection signal when the IC memory voltage drops below the reference voltage.

11. The method of claim 10, wherein a switching control means receives the voltage detection signal and controls the first, second and third switches so as to connect the IC memory to the first and second electrical paths when the voltage detection signal is one logic level, and to connect the IC memory to the third electrical path when the voltage detection signal is a second logic level.

12. A circuit for supplying power to an IC memory, said circuit including a reserve power supply including primary and secondary batteries, a second battery charging circuit for charging said secondary battery, and a primary and secondary battery backup circuit for connecting said primary and secondary batteries to the IC memory, the circuit further comprising:

a first electrical path for providing power and operating voltage to said IC memory from said secondary battery when primary power to said IC memory is discontinued;

a second electrical path for providing power and operating voltage to said IC memory from said primary battery when primary power to said IC memory is discontinued, and voltage supplied by said secondary battery falls below a voltage level supplied by said primary battery;

a third electrical path for providing power and operating voltage to said IC memory from both of said primary and secondary batteries in series when primary power to said IC memory is discontinued and the voltage supplied by said primary and second batteries falls below a reference level.

13. The circuit of claim 12, further including a first switch for electrically connecting only the first and second electrical paths to the IC memory to provide power and voltage when the combined voltage supplied by said primary and secondary batteries exceeds a reference level, and second and third switches for electrically connecting only the third electrical path to said IC memory to provide power and voltage when the combined voltage supplied by said primary and secondary batteries falls below a reference level.

14. The circuit of claim 12, further comprising a voltage detecting means for comparing a voltage supplied to said IC memory by said primary and secondary batteries with a reference voltage, and for generating a voltage detection signal when the voltage supplied to the IC memory drops below the reference voltage.

15. The circuit of claim 14, further including a switching control means for receiving the voltage detection signal from said voltage detecting means, and for controlling the first, second and third switches so as to connect the IC memory to the first and second electrical paths when the voltage detection signal is one logic level, and to connect the IC memory to the third electrical path when the voltage detection signal is a second logic level.

16. The circuit of claim 13, wherein the first switch connects the primary and secondary batteries in parallel in the first and second electrical paths, and the second and third switches connect the primary and secondary batteries in series in the third electrical path.

17. The circuit of claim 14, wherein said voltage detecting means is a comparator.

18. The circuit of claim 15, wherein:

the first switch is connected between a negative terminal of said secondary battery and a ground line;

the second switch is connected between a positive terminal of said primary battery and the negative terminal of said secondary battery; and the third switch is connected between a positive terminal of said secondary battery and a power terminal of said memory IC.

19. The circuit of claim 15, wherein said switching control means comprises:

a JK flip flop having an input for receiving the voltage detection signal from the voltage detecting means through a clock input terminal, a reset input for receiving an external voltage from the primary power source, and an output for controlling the first, second and third switches; and wherein when the voltage detection signal is one logical level, the JK output activates the first switch to connects the primary and secondary batteries in parallel through the first and second electrical paths, and when the voltage detection signal is a second logical level, the JK output activates the second and third switches to connects the primary and secondary batteries in serial through the third electrical path.

20. The circuit of claim 13, wherein:

the first electrical path includes a first ground voltage, the first switch, the secondary battery and a first diode connected to said IC memory;

the second electrical path includes a second ground voltage, the primary battery, a resistor and a second diode connected to said IC memory; and the third electrical path includes the second ground voltage, the primary battery, the second switch, the secondary battery and the third switch connected to said IC memory.

21. A voltage circuit for a device including memory that receives a primary voltage from a primary power supply that may be connected and disconnected, comprising:

a first battery;

a second battery; and a switch control circuit coupled to the first and second batteries and to the device, wherein the switch control circuit couples the first and second batteries in parallel to provide voltage to the device upon disconnection of the primary power supply, wherein the switch control circuit couples the first and second batteries in series to provide voltage to the device if the voltage provided to the device is below a reference voltage level.

22. The circuit of claim 21, further comprising a voltage detector circuit receiving the voltage provided to the device and the reference voltage, wherein the voltage detector circuit provides a voltage detection signal to the switch control circuit when the voltage provided to the device is below the reference voltage level.

23. The circuit of claim 21, further comprising a charging circuit coupled to the first battery, wherein the charging circuit provides a charging voltage to the first battery when the primary power supply is connected.

24. The circuit of claim 21, wherein the first and second batteries are each coupled to the device with diodes when coupled in parallel, and wherein the first and second batteries are coupled to the device without diodes when coupled in series.

25. The circuit of claim 21, wherein the switch control circuit comprises first, second and third switches, wherein the first switch is coupled to the first battery so that the first and second batteries are coupled to the device in parallel upon disconnection of the power supply, wherein the second and third switches couple the first and second batteries to the device in series if the voltage provided to the device is below a reference voltage level.

26. The circuit of claim 24, wherein the voltage supplied by the first battery is greater than the voltage supplied by the second battery.

27. A method for providing power to a device including memory that receives a primary voltage from a primary power supply that may be connected and disconnected, comprising the steps of:

coupling first and second batteries to the device if the primary power supply is disconnected, wherein the first and second batteries are coupled to the device in parallel if voltage provided to the device by the parallely coupled first and second batteries is not below a reference voltage level; and coupling the first and second batteries to the device in series if the voltage provided to the device by the parallely coupled first and second batteries is below the reference voltage level.

28. The method of claim 27, further comprising the step of charging the first battery when the primary power supply is connected.

29. The method of claim 27, further comprising the step of comparing the voltage provided to the device by the parallely coupled first and second batteries to the reference voltage level, and generating a voltage detection signal if the voltage provided to the device is below the reference voltage level.

30. The method of claim 29, wherein the first and second batteries are coupled to the device in series in response to the voltage detection signal.

* * * * *